United States Patent
Lee et al.

(10) Patent No.: US 12,489,028 B2
(45) Date of Patent: Dec. 2, 2025

(54) ELECTRODE STRUCTURE INCLUDING METAL AND HEAT DISSIPATION LAYER AND SEMICONDUCTOR INCLUDING THE ELECTRODE STRUCTURE

(71) Applicant: SAMSUNG ELECTRONICS CO., LTD., Suwon-si (KR)

(72) Inventors: Sang Hyun Lee, Gwangju (KR); Hokyun Rho, Jeongeup-si (KR); Min Hee Jeong, Gwangju (KR)

(73) Assignees: SAMSUNG ELECTRONICS CO., LTD., Suwon-si (KR); INDUSTRY FOUNDATION OF CHONNAM NATIONAL UNIVERSITY, Gwangju (KR)

( * ) Notice: Subject to any disclaimer, the term of this patent is extended or adjusted under 35 U.S.C. 154(b) by 559 days.

(21) Appl. No.: 17/874,400

(22) Filed: Jul. 27, 2022

(65) Prior Publication Data

US 2023/0178453 A1 Jun. 8, 2023

(30) Foreign Application Priority Data

Dec. 8, 2021 (KR) .................. 10-2021-0174553

(51) Int. Cl.
*H01L 23/373* (2006.01)
*H01L 21/48* (2006.01)
(Continued)

(52) U.S. Cl.
CPC ...... *H01L 23/3735* (2013.01); *H01L 21/4803* (2013.01); *H10B 12/315* (2023.02);
(Continued)

(58) Field of Classification Search
CPC ...... H10B 12/48; H10B 12/315; H10B 12/03; H01L 23/3677; H01L 23/373;
(Continued)

(56) References Cited

U.S. PATENT DOCUMENTS 9,082,757 B2 * 7/2015 Pelley .................. H01L 23/481
9,214,559 B2 12/2015 Lee et al.
(Continued)

FOREIGN PATENT DOCUMENTS

JP 2017-152643 8/2017
KR 10-2010-0086526 8/2010
(Continued)

OTHER PUBLICATIONS

Office Action dated Aug. 20, 2025 issued in corresponding Korean Patent Application No. 10-2021-0174553.

*Primary Examiner* — Khiem D Nguyen
(74) *Attorney, Agent, or Firm* — MORGAN, LEWIS & BOCKIUS LLP

(57) ABSTRACT

A semiconductor device includes a substrate. A first heat dissipation layer is disposed on the substrate and extends in a first direction. A metal layer is disposed on the first heat dissipation layer and extends in the first direction. A width of the first heat dissipation layer in a second direction intersecting the first direction is greater than a width of the metal layer in the second direction. The first heat dissipation layer has a structure made of carbon atoms and includes at least one among graphene, nanotubes, and a diamond structure.

20 Claims, 18 Drawing Sheets

(51) Int. Cl.
*H10B 12/00* (2023.01)
*H10D 30/43* (2025.01)
*H10D 30/67* (2025.01)
*H10D 62/10* (2025.01)

(52) U.S. Cl.
CPC ......... *H10D 30/43* (2025.01); *H10D 30/6735* (2025.01); *H10D 30/6757* (2025.01); *H10D 62/121* (2025.01)

(58) Field of Classification Search
CPC . H01L 23/3732; H01L 21/4803; H10D 30/43; H10D 30/6735; H10D 30/6757; H10D 62/121; G11C 11/4097
See application file for complete search history.

(56) References Cited

U.S. PATENT DOCUMENTS

| | | |
|---|---|---|
| 9,455,094 B2 | 9/2016 | Tour et al. |
| 10,497,893 B2 | 12/2019 | Moon et al. |
| 11,189,622 B1 * | 11/2021 | Yang ...................... H10B 12/34 |
| 2013/0098540 A1 * | 4/2013 | Lee .................... H10D 30/6741 428/209 |
| 2015/0255464 A1 | 9/2015 | Lee et al. |
| 2015/0351285 A1 * | 12/2015 | Noda ..................... H01L 23/373 427/249.1 |
| 2019/0267088 A1 * | 8/2019 | Jeon ..................... H01L 23/5329 |
| 2021/0005527 A1 | 1/2021 | Choi et al. |
| 2021/0134644 A1 * | 5/2021 | Or-Bach ................. H10B 41/40 |
| 2021/0233826 A1 | 7/2021 | Park et al. |
| 2022/0359369 A1 * | 11/2022 | Tsai ........................ H01L 23/46 |

FOREIGN PATENT DOCUMENTS

| | | |
|---|---|---|
| KR | 10-2011-0107065 A | 9/2011 |
| KR | 10-1207987 | 12/2012 |
| KR | 10-1213031 | 12/2012 |
| KR | 10-2014-0108908 | 9/2014 |
| KR | 10-2015-0104362 A | 9/2015 |
| KR | 10-2018-0108219 | 10/2018 |
| KR | 10-2021-0004027 A | 1/2021 |

* cited by examiner

FIG. 17
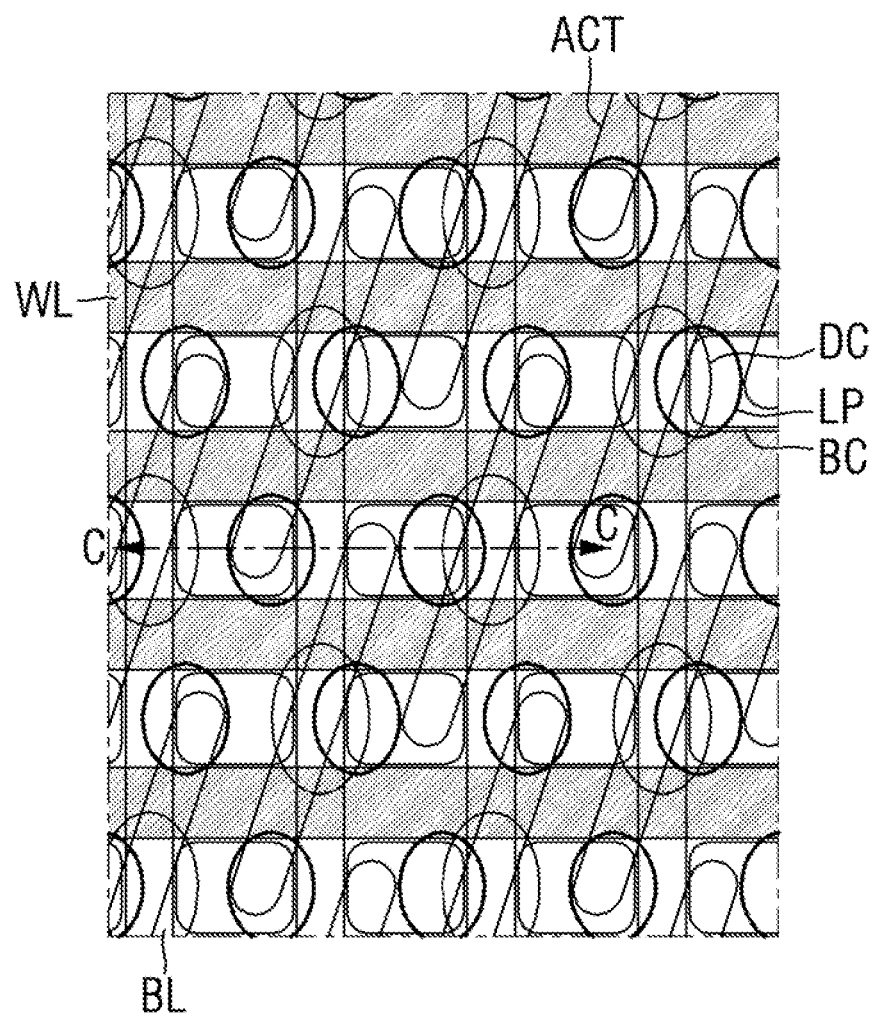
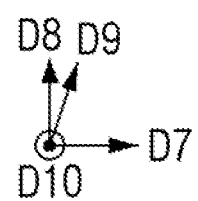

ELECTRODE STRUCTURE INCLUDING METAL AND HEAT DISSIPATION LAYER AND SEMICONDUCTOR INCLUDING THE ELECTRODE STRUCTURE

CROSS-REFERENCE TO RELATED APPLICATION

This application claims priority under 35 U.S.C. § 119 to Korean Patent Application No. 10-2021-0174553, filed on Dec. 8, 2021 in the Korean Intellectual Property Office, the disclosure of which is incorporated by reference in its entirety herein.

1. TECHNICAL FIELD

The present disclosure relates to an electrode structure including a metal and a heat dissipation layer and a semiconductor device including the same. More particularly, the present disclosure relates to a semiconductor device with an electrode structure including a heat dissipation layer having a predetermined width and a metal layer having a width different from the predetermined width on the heat dissipation layer.

2. DISCUSSION OF RELATED ART

Semiconductor elements are being developed to provide high integration and miniaturization. Next-generation semiconductor elements require materials with excellent physical properties that exceed the limitations of existing materials. Due to high conductivity, metal materials such as copper and aluminum are widely used in a semiconductor element and an electrode structure.

However, an electromigration phenomenon in which line disconnection occurs due to movement of metal ions at a high current can occur when the semiconductor element and electrode structure include metal materials, such as copper and aluminum. Therefore, research is being conducted to develop an allowable current limit that is higher than that of the existing materials. For example, research is being conducted on a composite material using a carbon structure including, for example, graphite, diamond, carbon nanotubes, or the like. These carbon materials have a high allowable current limit, low resistance, and high mechanical strength when compared with metal materials. In addition, a carbon material layer inhibits diffusion of metal atoms to suppress the electromigration phenomenon. Further, due to the high thermal conductivity of a carbon material, it is possible to delay line disconnection generated due to heat.

Recently, many studies are being conducted on application of composite materials using carbon materials, and it is necessary to develop a material capable of stably transmitting electricity at a higher current.

SUMMARY

Aspects of the present disclosure provide a semiconductor device including an electrode structure which has a high allowable current limit and a continuous current flow after a short circuit.

It should be noted that objects of the present disclosure are not limited to the above-described objects, and other objects of the present disclosure will be apparent to those skilled in the art from the following descriptions.

According to an embodiment of the present disclosure, a semiconductor device includes a substrate. A first heat dissipation layer is disposed on the substrate and extends in a first direction. A metal layer is disposed on the first heat dissipation layer and extends in the first direction. A width of the first heat dissipation layer in a second direction intersecting the first direction is greater than a width of the metal layer in the second direction. The first heat dissipation layer has a structure made of carbon atoms and includes at least one among graphene, nanotubes, and a diamond structure.

According to an embodiment of the present disclosure, a semiconductor device includes a substrate. An active pattern is on the substrate and extends in a first direction. A gate electrode is disposed on the active pattern and extends in a second direction intersecting the first direction. A line structure is disposed on the gate electrode and extends in the first direction. The line structure includes a first line heat dissipation layer and a line metal layer on the first line heat dissipation layer. A width of the first line heat dissipation layer in the second direction is greater than a width of the line metal layer in the second direction. The first line heat dissipation layer has a structure made of carbon atoms and includes at least one among graphene, nanotubes, and a diamond structure.

According to an embodiment of the present disclosure, a semiconductor device includes a substrate. Bit lines are on the substrate and extend in a first direction. A buried contact is disposed between the bit lines and is connected to the substrate. A landing pad is on the buried contact. A capacitor structure is disposed on the landing pad and is connected to the landing pad. The bit line includes a first bit line heat dissipation layer and a bit line metal layer on the first bit line heat dissipation layer. A width of the first bit line heat dissipation layer in a second direction intersecting the first direction is greater than a width of the bit line metal layer in the second direction. The first bit line heat dissipation layer has a structure made of carbon atoms and includes at least one among graphene, nanotubes, and a diamond structure.

BRIEF DESCRIPTION OF THE DRAWINGS

The above and other aspects and features of the present disclosure will become more apparent by describing in detail embodiments thereof with reference to the attached drawings, in which:

FIG. 17 is a layout diagram for describing the semiconductor device according to an embodiment of the present disclosure.

DETAILED DESCRIPTION OF EMBODIMENTS

Hereinafter, in order to describe the present disclosure in more detail, some embodiments of the present disclosure will be described in more detail with reference to the accompanying drawings.

Figure 1:
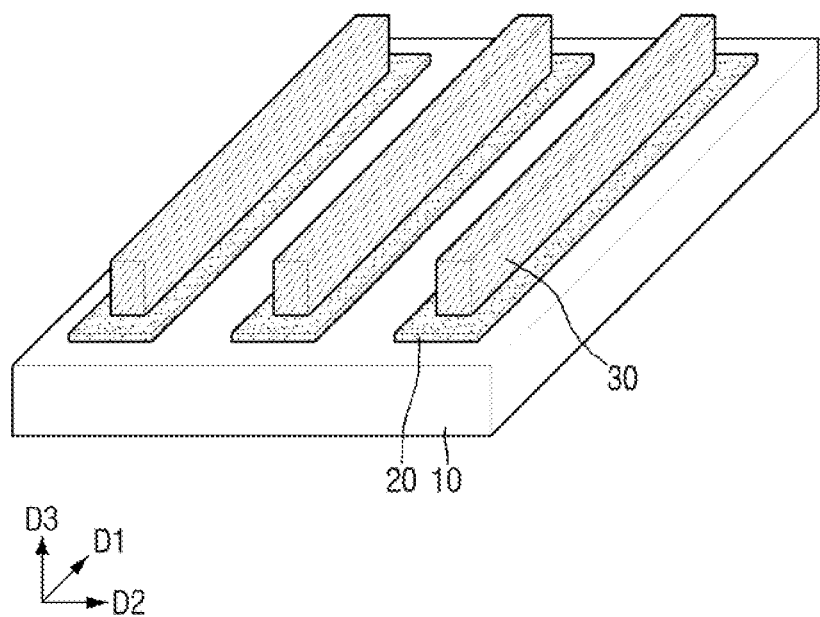
FIG. 1 is a perspective view for describing a semiconductor device including an electrode structure including a metal and a heat dissipation layer according to an embodiment of the present disclosure.
Figure 2:
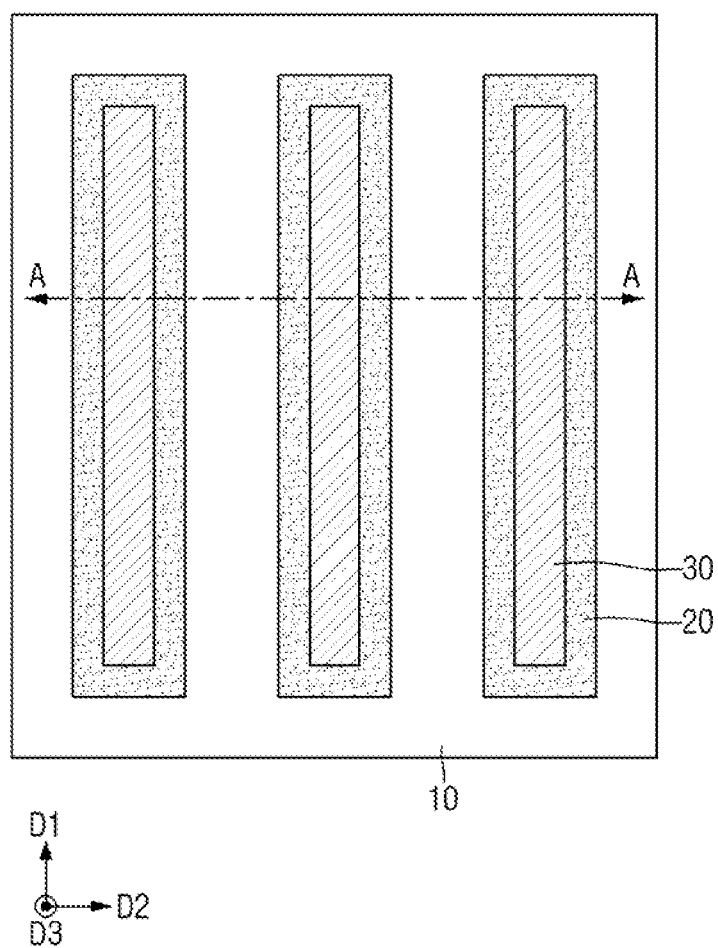
FIG. 2 is a plan view illustrating the semiconductor device of FIG. 1 according to an embodiment of the present disclosure.
Figure 3:
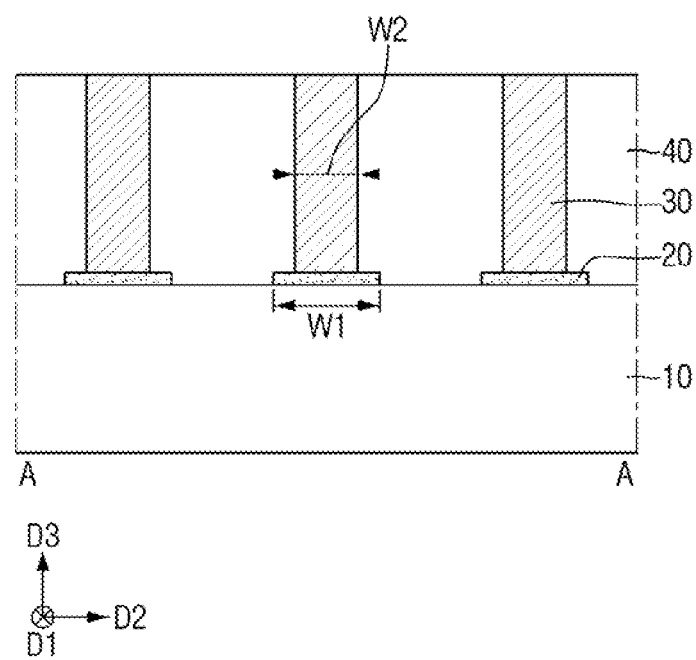
FIG. 3 is a cross-sectional view taken along line A-A of FIG. 2 according to an embodiment of the present disclosure.

FIG. 1 is an exemplary perspective view for describing a semiconductor device including an electrode structure including a metal and a heat dissipation layer according to some embodiments. FIG. 2 is an exemplary plan view illustrating the semiconductor device of FIG. 1. FIG. 3 is a cross-sectional view along line A-A of FIG. 2.

Referring to FIGS. 1 to 3, the semiconductor device according to some embodiments may include a first substrate 10, a first heat dissipation layer 20, a first metal layer 30, and a first interlayer insulating layer 40.

In an embodiment, the first substrate 10 may be a silicon substrate or a silicon-on-insulator (SOI). Alternatively, the first substrate 10 may include silicon germanium, silicon germanium on insulator (SGOI), indium antimonide, a lead tellurium compound, indium arsenide, indium phosphide, gallium arsenide, or gallium antimonide. However, embodiments of the present disclosure are not necessarily limited thereto.

The first heat dissipation layer 20 may be disposed on the first substrate 10. Although it is illustrated that the first heat dissipation layer 20 is directly disposed on the first substrate 10 (e.g., in the third direction D3), embodiments of the present disclosure are not necessarily limited thereto. For example, in an embodiment, transistors or a plurality of lines may be disposed between the first substrate 10 and the first heat dissipation layer 20 (e.g., in the third direction D3).

In an embodiment, the first heat dissipation layer 20 may extend in a first direction D1. The first heat dissipation layer 20 may include a long side extending in the first direction D1 and a short side extending in a second direction D2. The first direction D1 may be substantially orthogonal to the second direction D2. The third direction D3 may be substantially orthogonal to the first direction D1 and the second direction D2. However, embodiments of the present disclosure are not necessarily limited thereto and the first to third directions D1 to D3 may cross each other in various different angles.

In an embodiment, the first heat dissipation layer 20 may have a structure made of carbon atoms. For example, the first heat dissipation layer 20 may include at least one among graphene, nanotubes, and a diamond structure. The first heat dissipation layer 20 may include graphene. However, embodiments of the present disclosure are not necessarily limited thereto.

Since the first heat dissipation layer 20 is formed of carbon atoms, an electrical conductivity characteristic of the first metal layer 30 formed on the first heat dissipation layer 20 can be increased due to the first heat dissipation layer 20. In addition, an electrode structure including the first heat dissipation layer 20 and the first metal layer 30 may have a high allowable current limit value. Further, in the semiconductor device according to some embodiments, even when the first metal layer 30 is short-circuited at an allowable current limit, a predetermined amount of current may flow. Accordingly, it is possible to prevent the device from malfunctioning and being damaged due to a rapid change in current.

The first metal layer 30 may be disposed on the first heat dissipation layer 20 (e.g., directly thereon in the third direction D3). The first metal layer 30 may extend in the first direction D1. In an embodiment, the first metal layer 30 may include a long side extending in the first direction D1 and a short side extending in the second direction D2.

The first metal layer 30 may include a conductive material. For example, in an embodiment the first metal layer 30 may include at least one among copper (Cu), ruthenium (Ru), aluminum (Al), cobalt (Co), tungsten (W), molybdenum (Mo), titanium (Ti), tantalum (Ta), nickel (Ni), platinum (Pt), chromium (Cr), and a combination thereof. The first metal layer 30 may include Cu. However, embodiments of the present disclosure are not necessarily limited thereto.

The first heat dissipation layer 20 and the first metal layer 30 are each illustrated in the form of a line extending in one direction. However, embodiments of the present disclosure are not necessarily limited thereto. Alternatively, the first heat dissipation layer 20 and the first metal layer 30 may each have an island shape.

In some embodiments, a width W1 (FIG. 3) of the first heat dissipation layer 20 in the second direction D2 is greater than a width W2 (FIG. 3) of the first metal layer 30 in the second direction D2. A length of the short side of the first heat dissipation layer 20 is greater than a length of the short side of the first metal layer 30. In addition, in a plane extending in the first direction D1 and the second direction D2, an area of the first heat dissipation layer 20 is greater than an area of the first metal layer 30. Since the area of the first heat dissipation layer 20 is greater than the area of the first metal layer 30, heat transferred to the first metal layer 30 may be effectively distributed to the first heat dissipation layer 20. Accordingly, it is possible to implement the semiconductor device including an electrode structure of which the allowable current limit value is high.

The first interlayer insulating layer 40 may be disposed between the first heat dissipation layer 20 and the first metal layer 30 on the first substrate 10. The first interlayer insulating layer 40 may electrically insulate the first metal layer 30 from the first heat dissipation layer 20. The first interlayer insulating layer 40 may include an insulating material. For example, in an embodiment the first interlayer insulating layer 40 may include at least one among silicon oxide, silicon nitride, silicon oxynitride, and a low dielectric constant material.

FIGS. 4 to 10 are cross-sectional views illustrating semiconductor devices according to some embodiments. Hereinafter, the semiconductor devices according to various embodiments will be described with reference to FIGS. 4 to 10. For convenience of description, points different from those described with reference to FIGS. 1 to 3 will be mainly described and a repeated description of similar or identical elements may be omitted.

Figure 4:
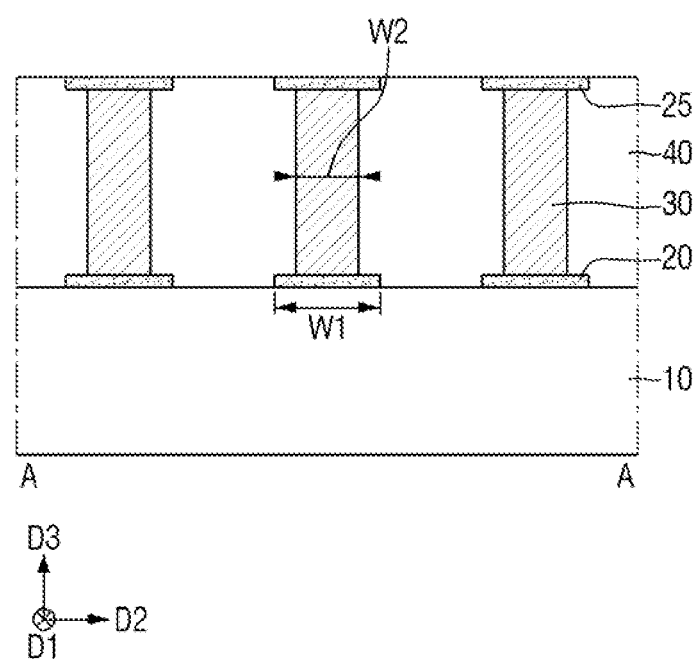
FIGS. 4 to 10 are cross-sectional views taken along line A-A illustrating semiconductor devices according to embodiments of the present disclosure.

First, referring to FIG. 4, the semiconductor devices according to some embodiments may further include a second heat dissipation layer 25 on the first metal layer 30.

The second heat dissipation layer 25 may cover a top surface of the first metal layer 30. For example, in an embodiment, the second heat dissipation layer 25 may completely cover the top surface of the first metal layer 30. However, embodiments of the present disclosure are not necessarily limited thereto and the second heat dissipation layer 25 may not completely overlap the first metal layer 30 in the second direction D2. For example, only a portion of the second heat dissipation layer 25 may overlap the first metal layer 30 in the second direction D2.

The second heat dissipation layer 25 may have a structure made of carbon atoms. For example, the second heat dissipation layer 25 may include at least one among graphene, nanotubes, and a diamond structure. The second heat dissipation layer 25 may include graphene. However, embodiments of the present disclosure are not necessarily limited thereto.

Since the first heat dissipation layer 20 and the second heat dissipation layer 25 are each made of carbon atoms, the electrical conductivity characteristic of the first metal layer 30 formed between the first heat dissipation layer 20 and the second heat dissipation layer 25 can be increased due to the first heat dissipation layer 20 and the second heat dissipation layer 25.

In some embodiments, a width of the second heat dissipation layer 25 in the second direction D2 is greater than the width W2 of the first metal layer 30 in the second direction D2. Since an area of the second heat dissipation layer 25 is greater than the area of the first metal layer 30, heat transferred to the first metal layer 30 may be effectively distributed to the second heat dissipation layer 25. Accordingly, it is possible to implement the semiconductor device including an electrode structure of which an allowable current limit value is high.

Figure 5:
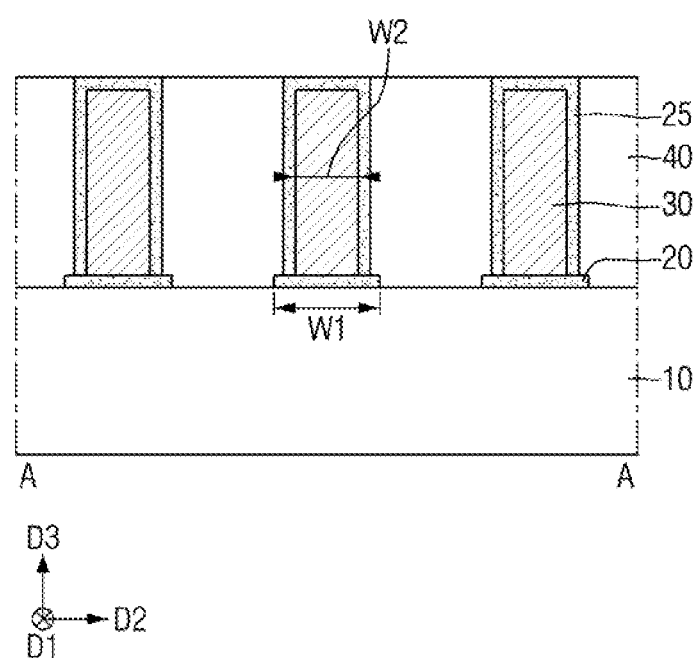

Referring to FIG. 5, the second heat dissipation layer 25 may entirely cover the first metal layer 30.

For example, the second heat dissipation layer 25 may cover sidewalls of the first metal layer 30 and cover the top surface of the first metal layer 30. Accordingly, a portion of the second heat dissipation layer 25 may overlap the first metal layer 30 in the second direction D2.

Since the second heat dissipation layer 25 entirely covers the first metal layer 30, heat transferred to the first metal layer 30 may be distributed more to the second heat dissipation layer 25.

Figure 6:
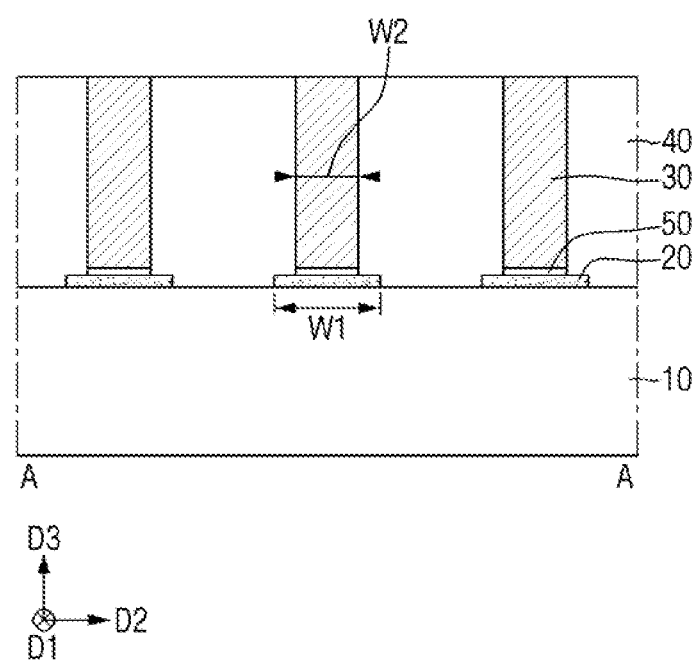

Referring to FIG. 6, the semiconductor device according to some embodiments may further include a first adhesive layer 50.

The first adhesive layer 50 may be interposed between the first heat dissipation layer 20 and the first metal layer 30 (e.g., in the third direction D3). Since the first heat dissipation layer 20 includes carbon, adhesion between the first heat dissipation layer 20 and the first metal layer 30 can be difficult. Accordingly, the first adhesive layer 50 is disposed between the first heat dissipation layer 20 and the first metal layer 30 so that adhesive strength between the first heat dissipation layer 20 and the first metal layer 30 may be increased. Although it is illustrated that a width of the first adhesive layer 50 in the second direction D2 is the same as the width of the first metal layer 30 in the second direction D2, it is only for convenience of description and embodiments of the present disclosure are not necessarily limited thereto.

The first adhesive layer 50 may include, for example, at least one among Ti, Cr, Ni, iron (Fe), and a combination thereof. However, embodiments of the present disclosure are not necessarily limited thereto.

Figure 7:
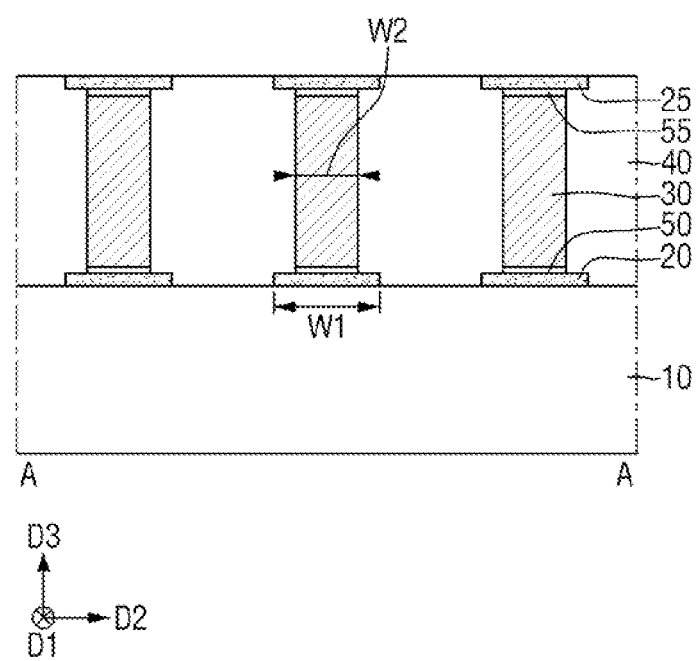

Referring to FIG. 7, the semiconductor device according to some embodiments may further include a second adhesive layer 55.

The second adhesive layer 55 may be interposed between the second heat dissipation layer 25 and the first metal layer 30 (e.g., in the third direction D3). The second adhesive layer 55 may increase adhesive strength between the second heat dissipation layer 25 and the first metal layer 30. Although it is illustrated that a width of the second adhesive layer 55 in the second direction D2 is the same as the width of the first metal layer 30 in the second direction D2, it is only for convenience of description and embodiments of the present disclosure are not necessarily limited thereto.

In an embodiment, the second adhesive layer 55 may include, for example, at least one among Ti, Cr, Ni, Fe, and a combination thereof. However, embodiments of the present disclosure are not necessarily limited thereto.

Figure 8:
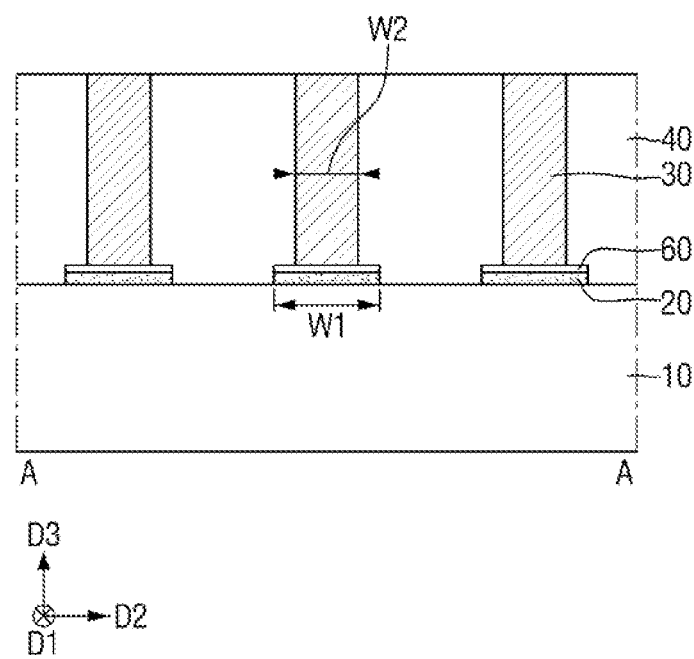

Referring to FIG. 8, the semiconductor device according to some embodiments may further include a first insulating layer 60.

The first insulating layer 60 may be interposed between the first heat dissipation layer 20 and the first metal layer 30 (e.g., in the third direction D3). The first insulating layer 60 may increase thermal conductivity of the first heat dissipation layer 20. In an embodiment, the first insulating layer 60 may include, for example, boron nitride. However, embodiments of the present disclosure are not necessarily limited thereto.

Although it is illustrated that the first insulating layer 60 is disposed on the first heat dissipation layer 20 (e.g., directly on an upper surface of the first heat dissipation layer 20), embodiments of the present disclosure are not necessarily limited thereto. For example, the boron nitride may be included in the first heat dissipation layer 20 at any position, and the first insulating layer 60 may be disposed below the first heat dissipation layer 20.

Figure 9:
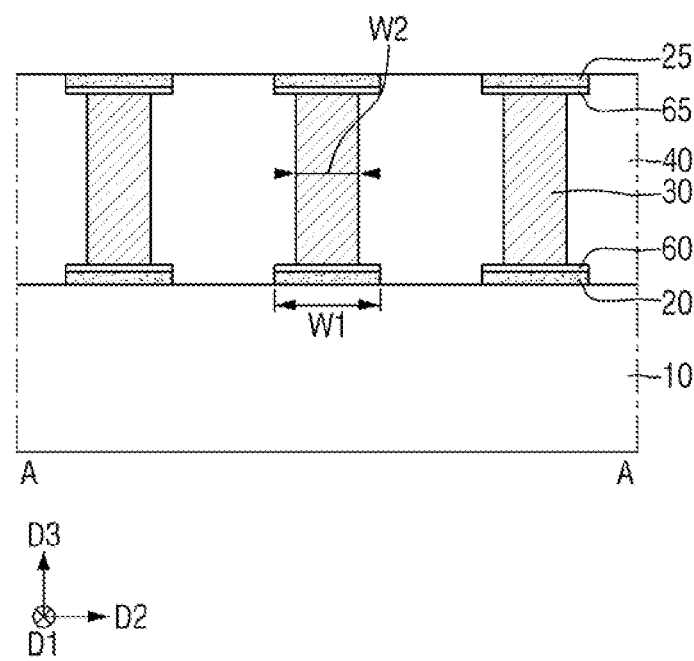

Referring to FIG. 9, the semiconductor device according to some embodiments may further include a second insulating layer 65.

The second insulating layer 65 may be interposed between the second heat dissipation layer 25 and the first metal layer 30 (e.g., in the third direction D3). The second insulating layer 65 may increase thermal conductivity of the second heat dissipation layer 25. In an embodiment, the second insulating layer 65 may include, for example, boron nitride. However, embodiments of the present disclosure are not necessarily limited thereto.

Figure 10:
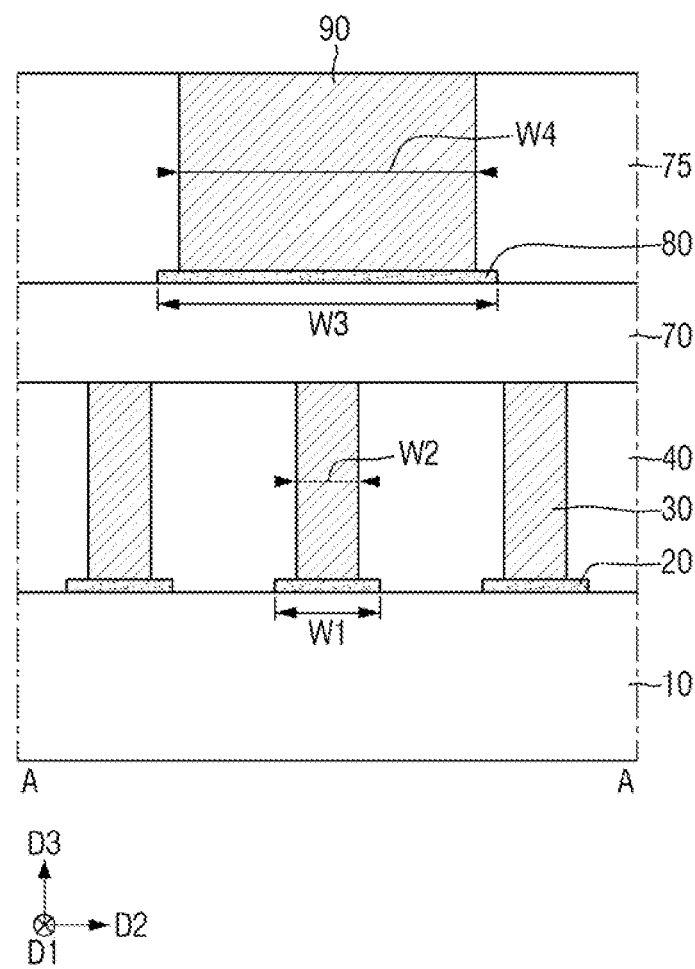

Referring to FIG. 10, the semiconductor device according to some embodiments may further include a first line level and a second line level.

The first line level may include the first heat dissipation layer 20, the first metal layer 30, and the first interlayer insulating layer 40. The second line level may include a third heat dissipation layer 80, a second metal layer 90, and a second interlayer insulating layer 75.

In some embodiments, an interlevel insulating layer 70 may be disposed between the first line level and the second line level (e.g., in the third direction D3). The interlevel insulating layer 70 may be disposed on the first interlayer insulating layer 40. The interlevel insulating layer 70 may include an insulating material. For example, in an embodiment the interlevel insulating layer 70 may include at least one among silicon oxide, silicon nitride, silicon oxynitride, and a low dielectric constant material.

The third heat dissipation layer 80 may be disposed on the interlevel insulating layer 70. The third heat dissipation layer 80 may extend in the second direction D2. The third heat dissipation layer 80 may have a structure made of carbon atoms. For example, in an embodiment the third heat dissipation layer 80 may include at least one among graphene, nanotubes, and a diamond structure. The third heat dissipation layer 80 may include graphene. However, embodiments of the present disclosure are not necessarily limited thereto.

The second metal layer 90 may be disposed on the third heat dissipation layer 80. The second metal layer 90 may extend in the second direction D2. The second metal layer 90 may include a conductive material. For example, in an embodiment the second metal layer 90 may include at least one among Cu, Ru, Al, Co, W, Mo, Ti, Ta, Ni, Pt, Cr, and a combination thereof. The second metal layer 90 may include Cu, but embodiments of the present disclosure are not necessarily limited thereto.

In some embodiments, a width W3 of the third heat dissipation layer 80 in the second direction D2 is greater than a width W4 of the second metal layer 90 in the second direction D2. Since the width of the third heat dissipation layer 80 is greater than the width of the second metal layer 90, heat transferred to the second metal layer 90 may be distributed to the third heat dissipation layer 80. Accordingly, it is possible to implement the semiconductor device including an electrode structure of which an allowable current limit value is high.

In an embodiment, the second interlayer insulating layer 75 may be disposed on both lateral sides of each of the third heat dissipation layer 80 and the second metal layer 90. The second interlayer insulating layer 75 may be disposed on the interlevel insulating layer 70. For example, the second interlayer insulating layer 75 may be disposed on an upper surface of the interlevel insulating layer 70. The second interlayer insulating layer 75 may include an insulating material. For example, in an embodiment the second interlayer insulating layer 75 may include at least one among silicon oxide, silicon nitride, silicon oxynitride, and a low dielectric constant material.

Figure 11:
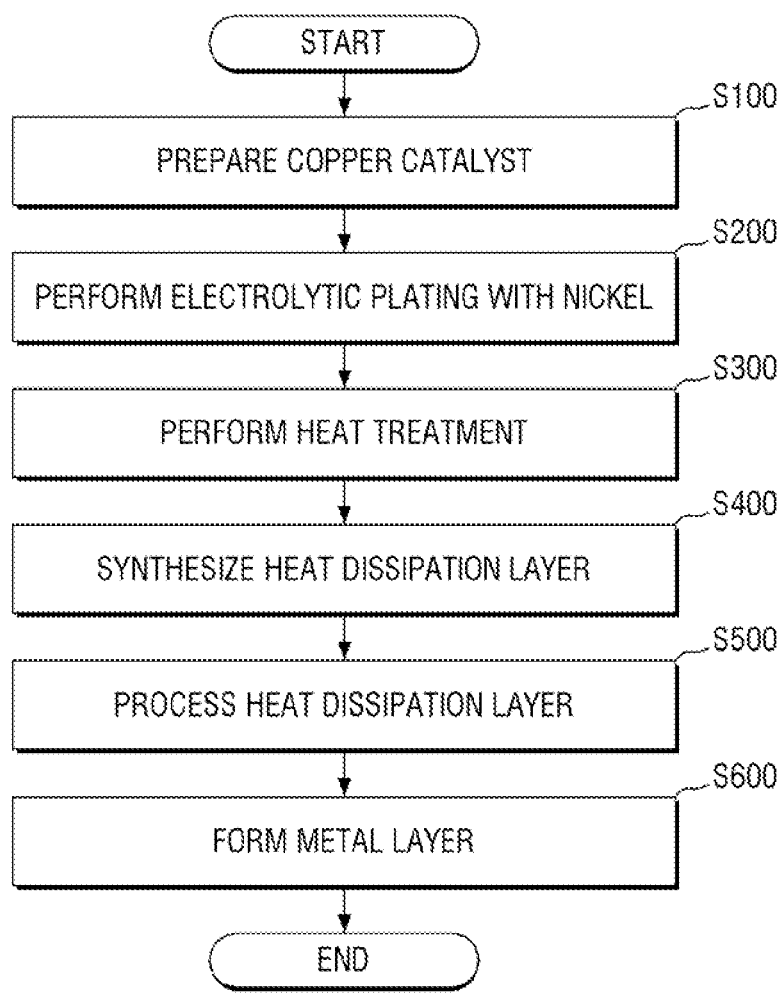
FIG. 11 is a flowchart for describing a method of manufacturing a semiconductor device including an electrode structure including a metal and a heat dissipation layer according to an embodiment of the present disclosure.

FIG. 11 is an exemplary flowchart for describing a method of manufacturing a semiconductor device including an electrode structure including a metal and a heat dissipation layer according to some embodiments. Hereinafter, the method of manufacturing a semiconductor device according to some embodiments will be described with reference to FIG. 11.

Referring to FIG. 11, the method of manufacturing a semiconductor device according to some embodiments may include preparing a copper catalyst in block S100, performing electrolytic plating with Ni in block S200, performing heat treatment in block S300, synthesizing a heat dissipation layer in block S400, processing the heat dissipation layer in block S500, and forming a metal layer in block S600.

Hereinafter, a method of manufacturing a semiconductor device according to some embodiments will be described in detail through an experimental example.

Experimental Example

A Cu foil having a width of 8 cm and a thickness of 35 μm was heat-treated at a temperature of 1000° C. in an argon/hydrogen gas atmosphere for two hours using thermal chemical vapor deposition (TCVD) equipment in block S100.

Ni with a thickness of 17 μm was formed on a surface of the heat-treated Cu foil for 12 minutes in a condition of a current density of 3 A/dm$^2$ using a Ni sulfamate plating solution prepared in a condition shown below in block S200, and the Ni was heat-treated at a temperature of 1000° C. in an argon/hydrogen gas atmosphere for two hours using the TCVD equipment in block S300.

TABLE 1

| Solution | Input |
|---|---|
| Ni(NH$_2$SO$_4$)$_2$ | 500 g/L |
| H$_3$BO$_3$ | 35 g/L |
| Additive (WA-192) | 3 mL/L |

Graphene was synthesized on a surface of the Cu—Ni alloy foil catalyst, on which the graphene was formed, at a temperature of 1000° C. in an argon/hydrogen/methane gas atmosphere for 15 hours using the TCVD equipment in block S400.

The Cu—Ni alloy catalyst, on which the graphene was formed, was etched for five minutes using a 40% nitric acid solution, and then a graphene layer was transferred onto a silicon substrate with a size of 1.5 cm×1.5 cm. A photolithography method and a plasma etching method were performed on the transferred graphene layer to form a graphene heat dissipation layer with a size of 100 μm×600 μm in block S500.

Cu with a thickness of 75 nm was formed at a center of the formed graphene heat dissipation layer using an electron beam evaporator, and a copper channel with a size of 20 μm×600 μm was formed through a photolithography method and a wet etching method. Then, a layer for current injection was formed and a sample was completely made in block S600.

Comparative Example

Cu with a thickness of 75 nm was formed on a silicon substrate with a size of 1.5 cm×1.5 cm using an electron beam evaporator, and a copper channel with a size of 20 μm×600 μm was formed through a photolithography method and a wet etching method.

Then, a layer for current injection was formed and a sample was completely made.

Figure 12:
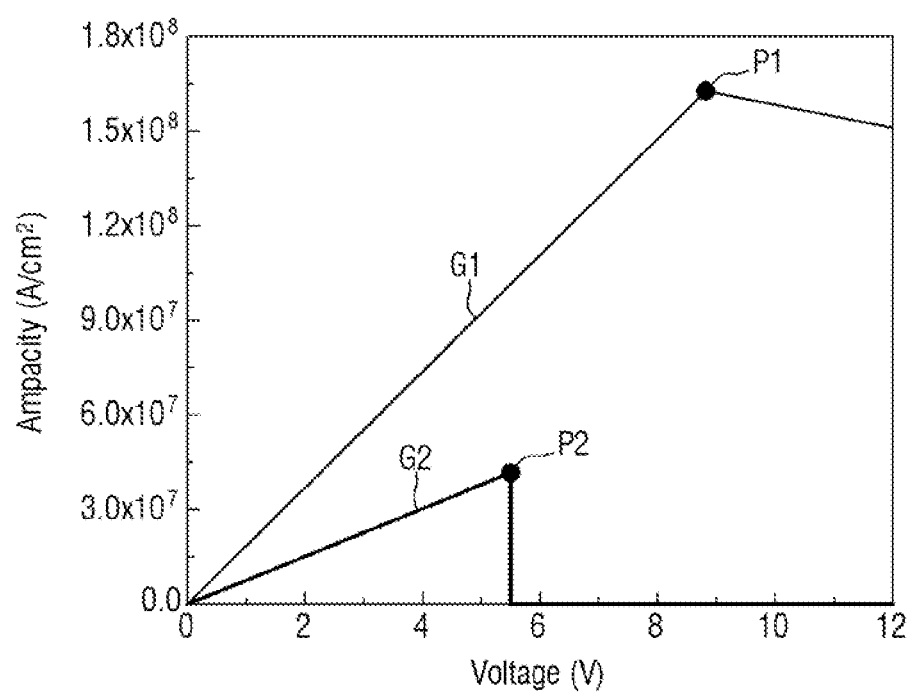
FIG. 12 is a graph for describing an effect of a semiconductor device according to an embodiment of the present disclosure.

FIG. 12 is a graph for describing an effect of a semiconductor device according to some embodiments. For reference, FIG. 12 is a graph showing measured allowable current limit values and measured current behaviors after line disconnection of the samples according to the experimental example and the comparative example.

Referring to FIG. 12, an x-axis denotes a voltage applied to the copper metal layer, and a y-axis denotes an allowable current limit value. A first graph G1 is a graph of the sample according to the experimental example. The sample according to the experimental example may include a heat dissipation layer including graphene and a metal layer including Cu. A second graph G2 is a graph of the sample according to the comparative example. The sample according to the comparative example includes only a metal layer including Cu without including a heat dissipation layer.

In FIG. 12, referring to the first graph G1, the sample according to the experimental example has an allowable current limit value at a first point P1. Referring to the second graph G2, the sample according to the comparative example has an allowable current limit value at a second point P2. The sample according to experimental example is not short-circuited until a voltage of about 9 V is applied, whereas the sample according to comparative example is short-circuited when a voltage of about 5.5 V or more is applied.

In addition, the sample according to the experimental example has an allowable current limit value of about $1.7 \times 10^8$ A/cm2, whereas the sample according to the comparative example has an allowable current limit value of about $4 \times 10^7$ A/cm2.

In addition, a predetermined amount of current flows even after the short circuit in the sample according to the experimental example, whereas a current does not flow after the short circuit in the sample according to the comparative example.

For example, an embodiment of the present disclosure in which the heat dissipation layer is included, it may have a higher allowable current limit value when compared with a comparative embodiment in which the heat dissipation layer is not included. In addition, even when a higher voltage is applied, a current may flow through the metal layer. Finally, a predetermined amount of current may flow even after the short circuit.

Figure 13:
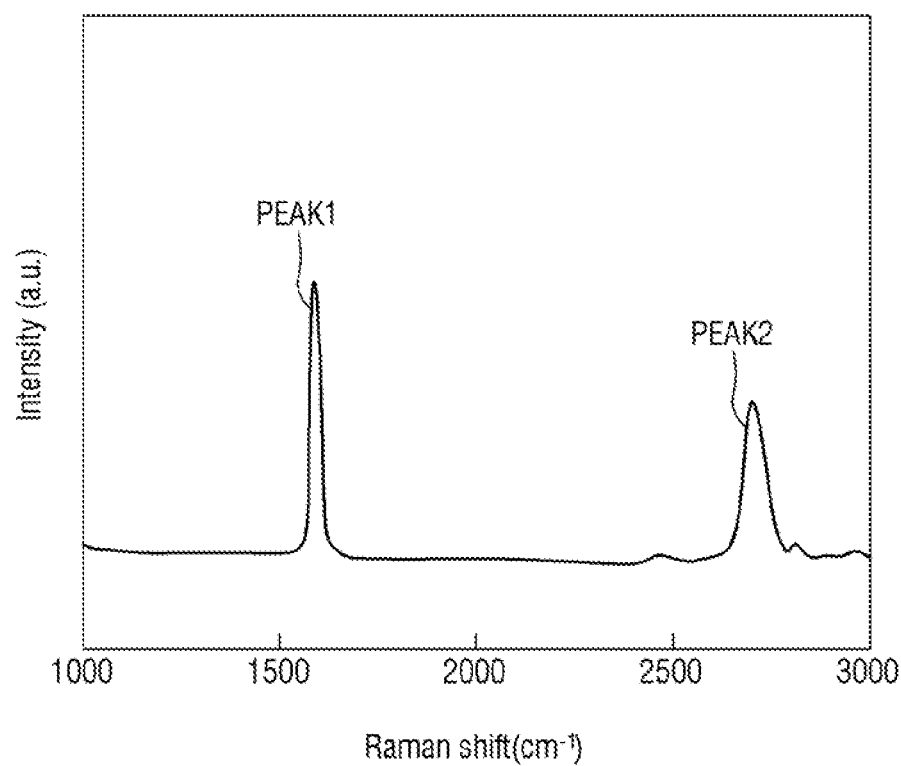
FIG. 13 is a graph for analyzing a characteristic of the graphene formed according to an embodiment of the present disclosure.

FIG. 13 is a graph for analyzing a characteristic of the graphene formed according to some embodiments. For reference, FIG. 13 is a graph for the sample according to the experimental example analyzed using a Raman spectroscopy method.

The Raman spectroscopy method is an experimental method of obtaining information on a molecular structure by measuring a Raman phenomenon in which, when light incident on a molecule is emitted and scattered, some of the incident light emits phonons as much as by vibrational energy of a material and loses energy.

Referring to FIG. 13, a first peak PEAK1 and a second peak PEAK2 may be measured. The first peak PEAK1 may be, for example, a G peak, and the second peak PEAK2 may be, for example, a 2D peak. A number of sheets of the graphene may be measured through intensities of the first peak PEAK1 and the second peak PEAK2.

Referring to the graph of FIG. 13, it can be seen that the graphene of the sample according to the experimental example is at least multi-layered graphene. Generally, when the intensity of the G peak is less than the intensity of the 2D peak, it may be determined that the graphene is single-layer graphene. When the intensity of the G peak is similar to the 2D peak, it may be determined that the graphene is graphene having two or three layers. When the intensity of the G peak is greater than the intensity of the 2D peak, it may be determined that the graphene is multilayer graphene. In FIG. 13, since the intensity of the first peak PEAK1 is greater than that of the second peak PEAK2, the graphene of the sample according to the experimental example may be multilayer graphene.

In addition, in FIG. 13, a D peak in the vicinity of 1380 $cm^{-1}$ is not found. In consideration of the above description, it may be determined that the graphene of the sample according to the experimental example has no defect.

Hereinafter, a semiconductor device having an electrode structure including a metal and a heat dissipation layer according to some embodiments will be described.

Figure 14:
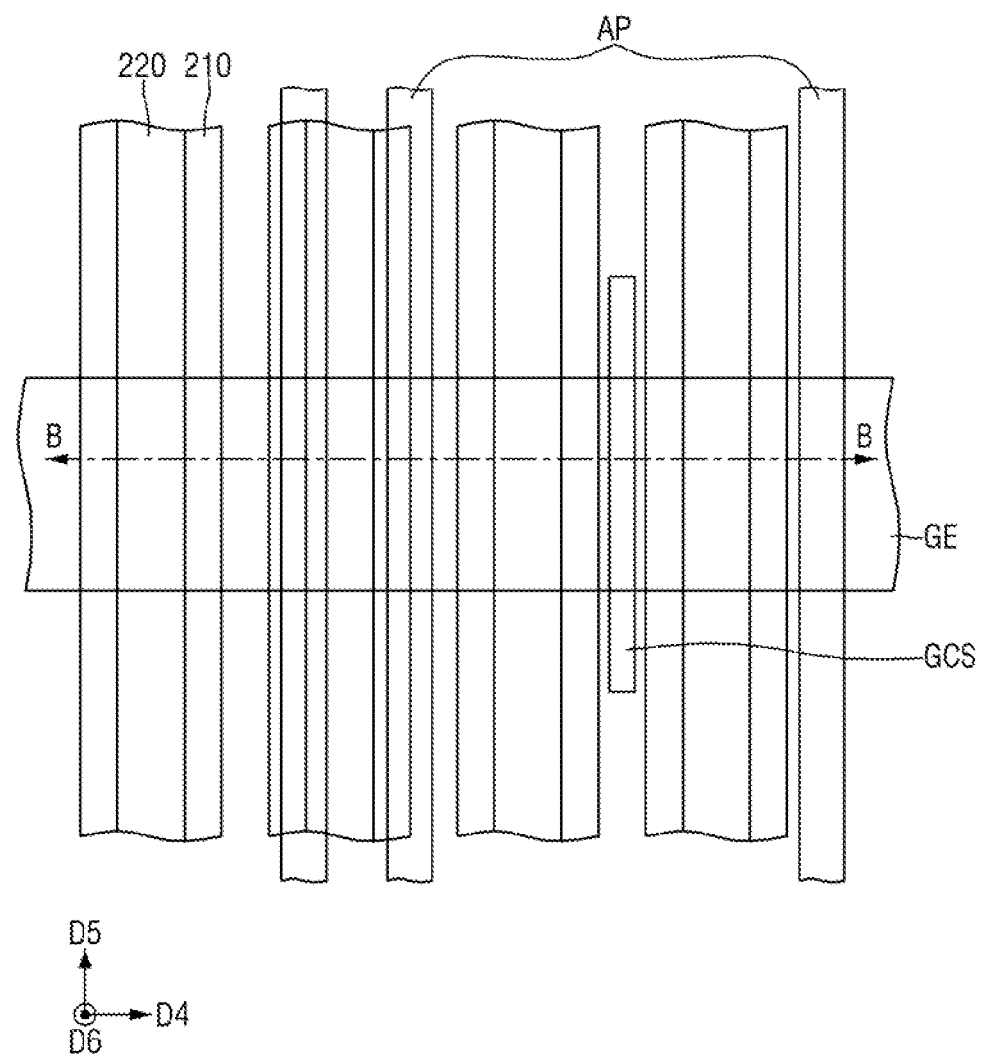
FIG. 14 is a layout diagram for describing a semiconductor device according to an embodiment of the present disclosure.
Figure 15:
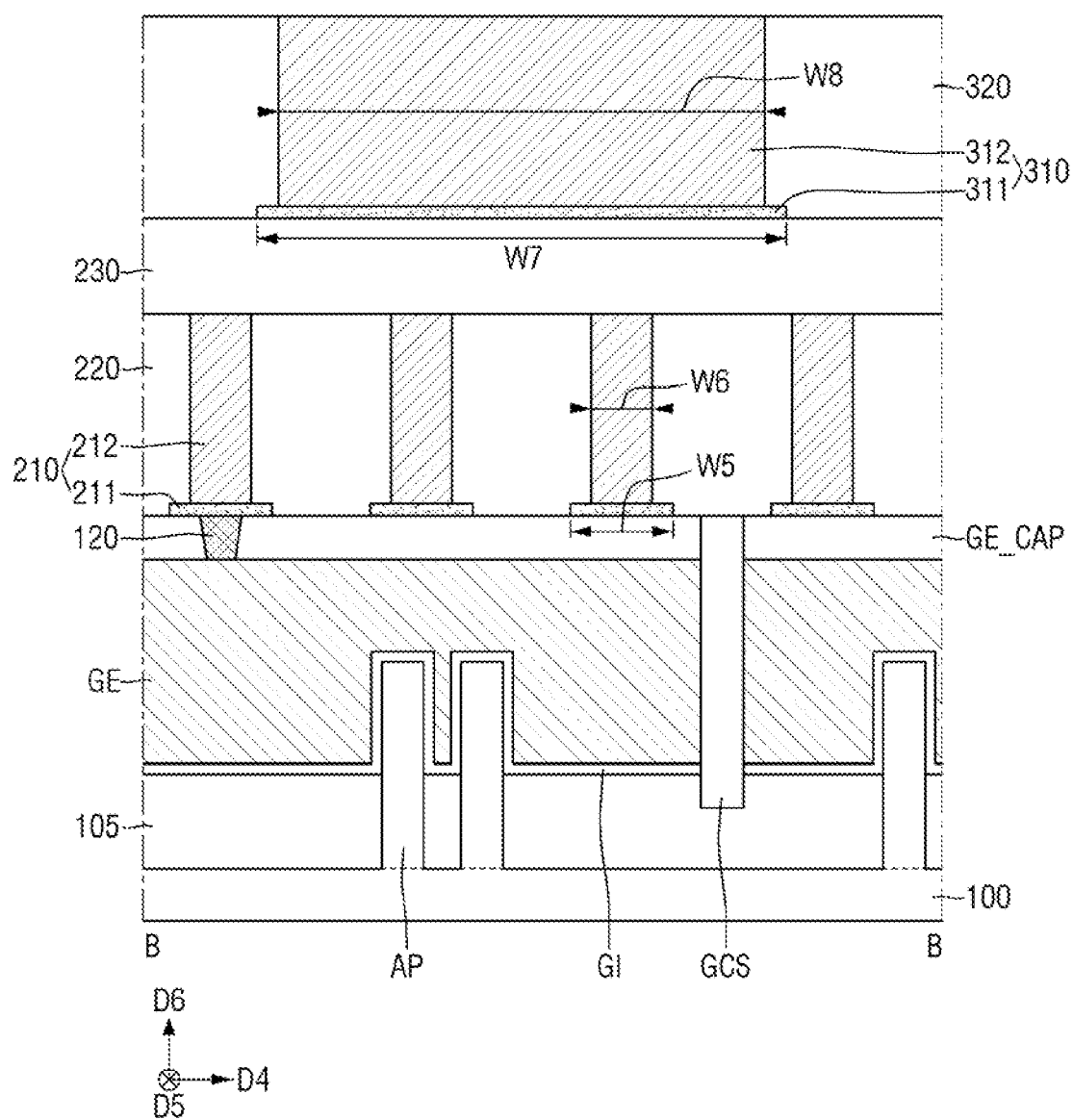
FIG. 15 is a cross-sectional view taken along line B-B of FIG. 14 according to an embodiment of the present disclosure.

FIG. 14 is an exemplary layout diagram for describing a semiconductor device according to some embodiments. FIG. 15 is a cross-sectional view along line B-B of FIG. 14.

Referring to FIGS. 14 and 15, the semiconductor device according to some embodiments may include a second substrate 100, an active pattern AP, a gate electrode GE, a first line structure 210, and a second line structure 310.

In an embodiment, the second substrate 100 may be a silicon substrate or an SOI. Alternatively, in an embodiment the second substrate 100 may include silicon germanium, SGOI, indium antimonide, a lead tellurium compound, indium arsenide, indium phosphide, gallium arsenide, or gallium antimonide. However, embodiments of the present disclosure are not necessarily limited thereto. The second substrate 100 may be substantially the same as the first substrate 10 of FIG. 1. However, embodiments of the present disclosure are not necessarily limited thereto.

The active pattern AP may be formed on the second substrate 100. In an embodiment, the active pattern AP may extend in a fifth direction D5. For example, the active pattern AP may include a long side extending in the fifth direction D5 and a short side extending in a fourth direction D4. The active pattern AP may be, for example, a fin-shaped pattern. The active pattern AP may include one or more fin-shaped patterns. The fin-shaped patterns may be spaced apart from each other in a fourth direction D4. Here, the fifth direction D5 and the fourth direction D4 may be substantially orthogonal to each other. A sixth direction D6 may be substantially orthogonal to the fifth direction D5 and the fourth direction D4. However, embodiments of the present disclosure are not necessarily limited thereto and the fourth to sixth directions D4 to D6 may cross each other at various different angles in some embodiments.

The active pattern AP may be a multi-channel active pattern. The active pattern AP may be used as a channel pattern of each transistor. The active pattern AP may be a portion of the second substrate 100 and may include an epitaxial layer grown from the second substrate 100. In an embodiment, the active pattern AP may include, for example, silicon (Si) or germanium (Ge), which is an elemental semiconductor material. In addition, the active pattern AP may include a compound semiconductor and include, for example, a group IV-IV compound semiconductor or a group III-V compound semiconductor.

The group IV-IV compound semiconductor may be, for example, a binary compound including two or more of carbon (C), Si, Ge, and tin (Sn), a ternary compound, or a compound in which the binary compound or the ternary compound is doped with a group IV element.

The group III-V compound semiconductor may be, for example, a binary compound, a ternary compound, or a quaternary compound, in which at least one of Al, Ga, and In as group III elements and one of phosphorus (P), arsenic (As), and antimonium (Sb) are combined and formed.

A field insulating layer 105 may be disposed on the second substrate 100. The field insulating layer 105 may be disposed on a portion of a sidewall of the active pattern AP. The active pattern AP may protrude higher than a top surface of the field insulating layer 105. In an embodiment, the field insulating layer 105 may include, for example, an oxide layer, a nitride layer, an oxynitride layer, or a combination layer thereof.

The gate electrode GE may be disposed on the active pattern AP. The gate electrode GE may extend in the fourth direction D4. The gate electrode GE may intersect the active pattern AP.

In an embodiment, the gate electrode GE may include, for example, at least one among a metal, a conductive metal nitride, a conductive metal carbonitride, a conductive metal carbide, a metal silicide, a doped semiconductor material, a conductive metal oxynitride, and a conductive metal oxide.

Agate insulating layer GI may be disposed between the gate electrode GE and the active pattern AP (e.g., in the sixth direction D6) and between the gate electrode GE and the field insulating layer 105 (e.g., in the sixth direction D6). The gate insulating layer G1 may include, for example, silicon oxide, silicon oxynitride, silicon nitride, or a high-dielectric constant material having a dielectric constant that is greater than that of the silicon oxide. The high-dielectric constant material may include, for example, at least one among boron nitride, metal oxide, and metal silicon oxide.

A gate separation structure GCS may be disposed on the field insulating layer 105. The gate separation structure GCS may separate an adjacent gate electrode GE in the fourth direction D4. The gate separation structure GCS may include, for example, an insulating material.

Although it is illustrated that the gate insulating layer GI does not extend in the sixth direction D6 along the sidewall of the gate separation structure GCS, embodiments of the present disclosure are not necessarily limited thereto. For example, in some embodiments the gate insulating layer G1 may extend in the sixth direction D6 along the sidewall of the gate separation structure GCS.

A gate capping pattern GE_CAP may be disposed on the gate electrode GE (e.g., disposed directly thereon in the sixth direction D6). The gate capping pattern GE_CAP may cover a top surface of the gate electrode GE. In an embodiment, the gate capping pattern GE_CAP may include, for example, silicon nitride. However, embodiments of the present disclosure are not necessarily limited thereto.

A conductive pattern 120 may be disposed on the gate electrode GE. The conductive pattern 120 may be connected to the gate electrode GE. For example, the conductive pattern 120 may be a gate contact.

A first line structure 210 may be disposed on the gate capping pattern GE_CAP. A portion of the first line structure 210 may be electrically connected to the conductive pattern 120. The first line structure 210 may include a first line heat dissipation layer 211 and a first line metal layer 212. The first line heat dissipation layer 211 may be substantially the same as the first heat dissipation layer 20 of FIG. 1. The first line metal layer 212 may be substantially the same as the first metal layer 30 of FIG. 1.

The first line heat dissipation layer 211 may have a structure made of carbon atoms. For example, in an embodiment the first line heat dissipation layer 211 may include at least one among graphene, nanotubes, and a diamond structure. The first line heat dissipation layer 211 may include graphene. However, embodiments of the present disclosure are not necessarily limited thereto.

The first line metal layer 212 may be disposed on the first line heat dissipation layer 211. The first line metal layer 212 may include a conductive material. For example, in an embodiment the first line metal layer 212 may include at least one among Cu, Ru, Al, Co, W, Mo, Ti, Ta, Ni, Pt, Cr, and a combination thereof. The first line metal layer 212 may include Cu. However, embodiments of the present disclosure are not necessarily limited thereto.

In some embodiments, a width W5 of the first line heat dissipation layer 211 in the fourth direction D4 is greater than a width W6 of the first line metal layer 212 in the fourth direction D4. Since the width of the first line heat dissipation layer 211 is greater than the width of the first line metal layer 212, heat transferred to the first line metal layer 212 may be effectively distributed to the first line heat dissipation layer 211. Accordingly, it is possible to implement the semiconductor device including a line structure of which an allowable current limit value is high.

A first line interlayer insulating layer 220 may surround the first line structure 210. The first line interlayer insulating layer 220 may include at least one among silicon oxide, silicon nitride, silicon oxynitride, and a low dielectric constant material.

In some embodiments, a line adhesive layer may be interposed between the first line heat dissipation layer 211 and the first line metal layer 212. The line adhesive layer may be substantially the same as, for example, the first adhesive layer 50 of FIG. 6. The line adhesive layer may increase adhesive strength between the first line heat dissipation layer 211 and the first line metal layer 212. In an embodiment, the line adhesive layer may include, for example, at least one among Ti, Cr, Ni, Fe, and a combination thereof. However, embodiments of the present disclosure are not necessarily limited thereto.

In an embodiment, a line insulating layer may be interposed between the first line heat dissipation layer 211 and the first line metal layer 212 (e.g., in the sixth direction D6). The line insulating layer may be substantially the same as, for example, the first insulating layer 60 of FIG. 8. The line insulating layer may improve thermal conductivity of the first line heat dissipation layer 211. In an embodiment, the line insulating layer may include, for example, boron nitride. However, embodiments of the present disclosure are not necessarily limited thereto.

In an embodiment, a line heat dissipation layer covering the first line metal layer 212 may be disposed on the first line metal layer 212 (e.g., disposed above the first line metal layer 212). The line heat dissipation layer may be substantially the same as, for example, the second heat dissipation layer 25 of FIGS. 4 and 5. For example, the first line metal layer 212 may be interposed between the first line heat dissipation layer 211 and the line heat dissipation layer (e.g., in the sixth direction D6). Since the first line metal layer 212 is interposed between the line heat dissipation layers, electrical conductivity of the first line metal layer 212 can be further increased.

An inter-line insulating layer 230 may be disposed on the first line interlayer insulating layer 220. The inter-line insulating layer 230 may insulate the first line structure 210 from a second line structure 310. The inter-line insulating layer 230 may include an insulating material. In an embodiment, the inter-line insulating layer 230 may include at least one among silicon oxide, silicon nitride, silicon oxynitride, and a low dielectric constant material.

The second line structure 310 may be disposed on the inter-line insulating layer 230 (e.g., disposed on an upper surface of the inter-line insulating layer 23). In an embodiment, the second line structure 310 may extend in the fourth direction D4. However, embodiments of the present disclosure are not necessarily limited thereto. The second line structure 310 may include a second line heat dissipation layer 311 and a second line metal layer 312. The second line heat dissipation layer 311 may be substantially the same as the third heat dissipation layer 80 of FIG. 10. The second line metal layer 312 may be substantially the same as the second metal layer 90 of FIG. 10.

The second line heat dissipation layer 311 may be disposed on the inter-line insulating layer 230. The second line heat dissipation layer 311 may extend in the fourth direction D4. The second line heat dissipation layer 311 may have a structure made of carbon atoms. For example, in an embodiment the second line heat dissipation layer 311 may include at least one among graphene, nanotubes, and a diamond structure. The second line heat dissipation layer 311 may include graphene. However, embodiments of the present disclosure are not necessarily limited thereto.

The second line metal layer 312 may be disposed on the second line heat dissipation layer 311. The second line metal layer 312 may extend in the fourth direction D4. The second line metal layer 312 may include a conductive material. For example, the second line metal layer 312 may include at least one among Cu, Ru, Al, Co, W, Mo, Ti, Ta, Ni, Pt, Cr, and a combination thereof. The second line metal layer 312 may include Cu. However, embodiments of the present disclosure are not necessarily limited thereto.

In some embodiments, a width W7 of the second line heat dissipation layer 311 in the fourth direction D4 is greater than a width W8 of the second line metal layer 312 in the fourth direction D4. Since the width of the second line heat dissipation layer 311 is greater than the width of the second line metal layer 312, heat transferred to the second line metal layer 312 may be effectively distributed to the second line heat dissipation layer 311. Accordingly, it is possible to implement the semiconductor device including a line structure of which an allowable current limit value is high.

A second line interlayer insulating layer 320 may be disposed on both lateral sides of each of the second line heat dissipation layer 311 and the second line metal layer 312. The second line interlayer insulating layer 320 may be disposed on the inter-line insulating layer 230. The second line interlayer insulating layer 320 may include an insulating material. For example, in an embodiment the second line interlayer insulating layer 320 may include at least one among silicon oxide, silicon nitride, silicon oxynitride, and a low dielectric constant material.

Figure 16:
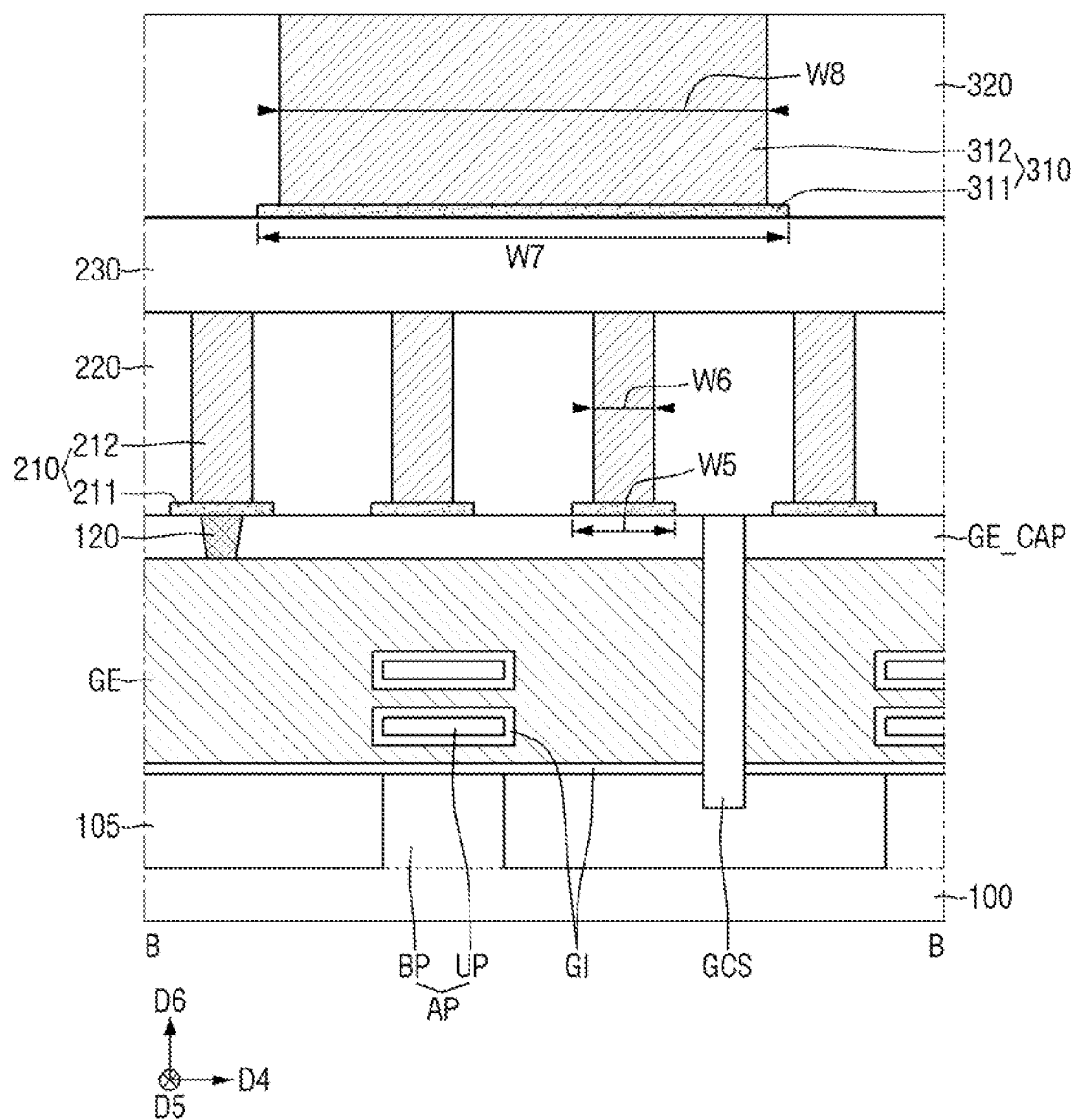
FIG. 16 is a cross-sectional view illustrating a semiconductor device according to an embodiment of the present disclosure.

FIG. 16 is a cross-sectional view illustrating a semiconductor device according to some embodiments. For convenience of description, points different from those described with reference to FIGS. 14 and 15 will be mainly described and a repeated description of similar or identical elements may be omitted.

Referring to FIG. 16, the semiconductor device according to some embodiments may include a multi-bridge channel field effect transistor (MBCFET™).

For example, the active pattern AP may include a lower pattern BP and a sheet pattern UP. The lower pattern BP may be disposed on the second substrate 100. The lower pattern BP may extend in the fifth direction D5. The sheet pattern UP may be disposed on the lower pattern BP. The sheet pattern UP may be spaced apart from the lower pattern BP in the sixth direction D6. Although two sheet patterns UP are illustrated, this is only for convenience of description and embodiments of the present disclosure are not necessarily limited thereto. For example, in some embodiments the number of sheet patterns UP may be one or three or more.

The lower pattern BP and the sheet pattern UP may each include, for example, Si or Ge, which is an elemental semiconductor material. The lower pattern BP and the sheet pattern UP may each include a compound semiconductor and include, for example, a group IV-IV compound semiconductor or a group III-V compound semiconductor. The lower pattern BP and the sheet pattern UP may include the same material or different materials.

Figure 18:
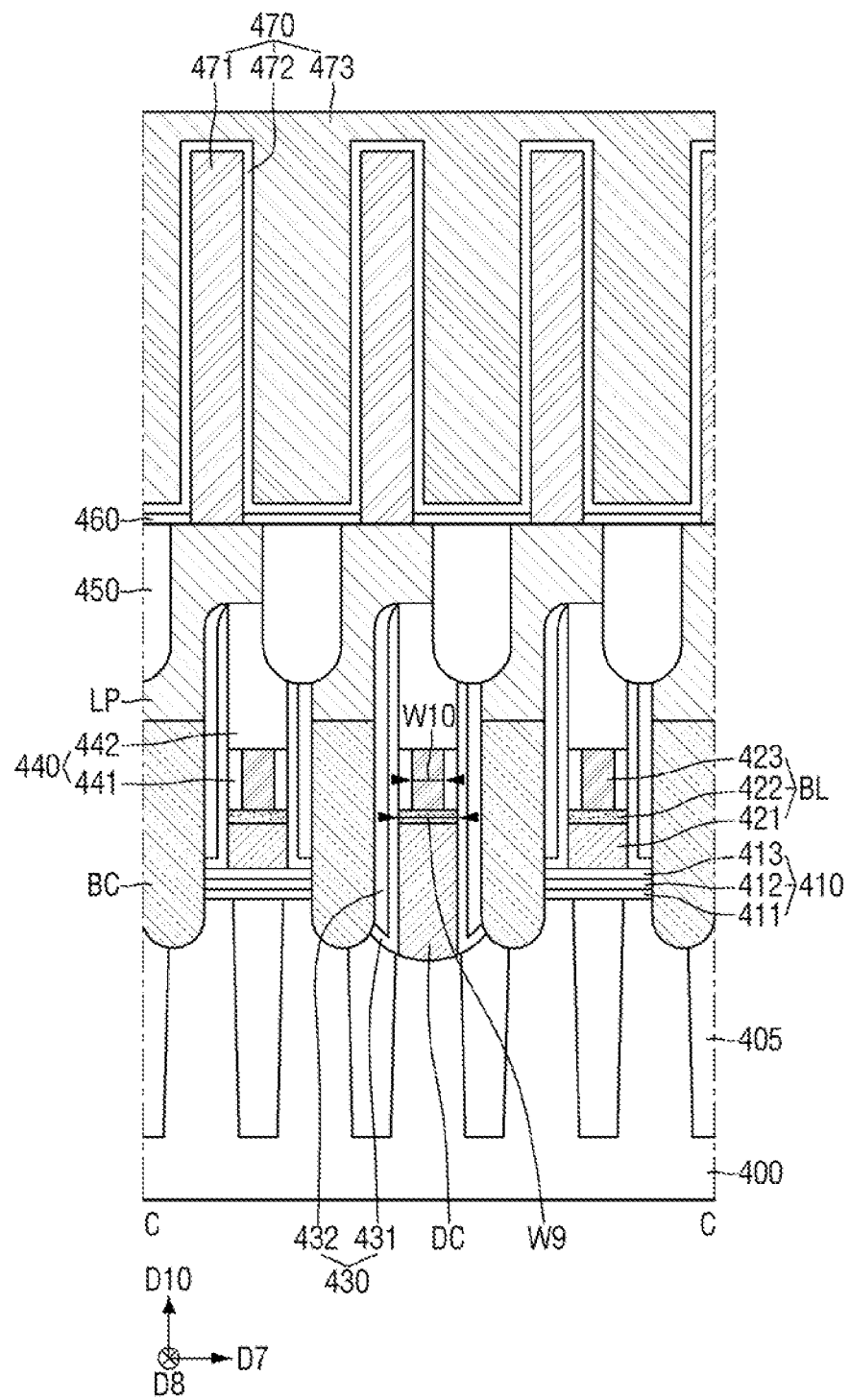
FIG. 18 is a cross-sectional view along line C-C of FIG. 17 according to an embodiment of the present disclosure.

FIG. 17 is a diagram for describing the semiconductor device according to some embodiments. FIG. 18 is a cross-sectional view along line C-C of FIG. 17. In an embodiment, the semiconductor device shown in FIGS. 17 and 18 may be, for example, a dynamic random access memory (DRAM). However, embodiments of the present disclosure are not necessarily limited thereto.

Referring to FIGS. 17 and 18, a third substrate 400 may be provided. In an embodiment, the third substrate 400 may be a silicon substrate or an SOI. Alternatively, the third substrate 400 may include silicon germanium, SGOI, indium antimonide, a lead tellurium compound, indium arsenide, indium phosphide, gallium arsenide, or gallium antimonide. However, embodiments of the present disclosure are not necessarily limited thereto. The third substrate 400 may be substantially the same as the first substrate 10 of FIG. 1.

An element separation layer 405 may be disposed in the third substrate 400. The element separation layer 405 may define active areas ACT. As shown in the drawing, as a design rule of the semiconductor device is reduced, the active area ACT may be disposed in the form of a diagonal line bar or an oblique line bar. For example, the active area ACT may extend in a ninth direction D9. The ninth direction D9 may be any direction between a seventh direction D7 and an eighth direction D8. The seventh direction D7 may be substantially orthogonal to the eighth direction D8. A tenth direction D10 may be substantially orthogonal to the seventh direction D7 and the eighth direction D8. However, embodiments of the present disclosure are not necessarily limited thereto.

The active areas ACT may be arranged parallel to each other in the seventh direction D7. In an embodiment, an end of one active area ACT may be arranged to be adjacent to a center of another adjacent active area ACT.

The semiconductor device according to some embodiments may include various contact layouts formed in the active area ACT. The various contact layouts may include, for example, direct contacts DC, buried contacts BC, and landing pads LP.

Here, a direct contact DC may be a contact which electrically connects the active area ACT to a bit line BL. A buried contact BC may be a contact which connects the active area ACT to a storage electrode 471. According to the layout structure, a contact area between the buried contact BC and the active area ACT may be relatively small. Accordingly, a conductive landing pad LP may be introduced to increase a contact area with the storage electrode 471 and increase the contact area with the active area ACT.

The landing pad LP may be disposed between the active area ACT and the buried contact BC or between the buried contact BC and the storage electrode 471. In the semiconductor device according to some embodiments, the landing pad LP may be disposed between the buried contact BC and the storage electrode 471. By increasing the contact area through the introduction of the landing pad LP, contact resistance between the active area ACT and the storage electrode 471 can be reduced.

Word lines WL may be buried in the third substrate 400. The word lines WL may cross the active area ACT. The word lines WL may extend in the seventh direction D7. The word lines WL may be spaced from each other in the eighth direction D8. The word lines WL may be embedded in the third substrate 400 and extend in the seventh direction D7. In an embodiment, a doped region may be formed in the active area ACT between the word lines WL. The doped region may be doped with an N-type impurity.

A buffer layer 410 may be disposed on the third substrate 400. The buffer layer 410 may include a first cell insulating layer 411, a second cell insulating layer 412, and a third cell insulating layer 413, which are sequentially stacked (e.g., in the tenth direction D10). The second cell insulating layer 412 may include a material having an etch selectivity with respect to the first cell insulating layer 411 and the third cell insulating layer 413. For example, the second cell insulating layer 412 may include silicon nitride. The first and third cell insulating layers 411 and 413 may each include silicon oxide.

Bit lines BL may be disposed on the buffer layer 410. The bit lines BL, may cross the third substrate 400 and the word lines WL. As shown in FIG. 17, in an embodiment the bit lines BL may extend in the eighth direction D8. The bit lines BL may be spaced apart from each other in the seventh direction D7.

The bit line BL may include a bit line lower electrode 421, a bit line heat dissipation layer 422, and a bit line metal layer 423, which are sequentially stacked (e.g., in the tenth direction D10). The bit line lower electrode 421 may include polysilicon doped with an impurity. The bit line heat dissipation layer 422 may be substantially the same as the first heat dissipation layer 20 of FIG. 1. The bit line metal layer 423 may be substantially the same as the first metal layer 30 of FIG. 1.

The bit line heat dissipation layer 422 may have a structure made of carbon atoms. For example, in an embodiment the bit line heat dissipation layer 422 may include at least one among graphene, nanotubes, and a diamond structure. The bit line heat dissipation layer 422 may include graphene. However, embodiments of the present disclosure are not necessarily limited thereto.

The bit line metal layer 423 may include a conductive material. For example, the bit line metal layer 423 may include at least one among Cu, Ru, Al, Co, W, Mo, Ti, Ta, Ni, Pt, Cr, and a combination thereof.

Since the bit line heat dissipation layer 422 is made of carbon atoms, electrical conductivity of the bit line metal layer 423 formed on the bit line heat dissipation layer 422 may be increased. The bit line heat dissipation layer 422 may distribute heat applied to the bit line metal layer 423.

In some embodiments, a width W9 of the bit line heat dissipation layer 422 in the seventh direction D7 is greater than a width W10 of the bit line metal layer 423 in the seventh direction D7. Since the width W9 of the bit line heat dissipation layer 422 is greater than the width W10 of the bit line metal layer 423, the bit line heat dissipation layer 422 may effectively distribute the heat applied to the bit line metal layer 423. Accordingly, it is possible to implement the semiconductor device including a bit line of which an allowable current limit value is high.

In some embodiments, a bit line adhesive layer may be interposed between the bit line heat dissipation layer 422 and the bit line metal layer 423 (e.g., in the tenth direction D10). The bit line adhesive layer may increase adhesive strength between the bit line heat dissipation layer 422 and the bit line metal layer 423. The bit line adhesive layer may be substantially the same as the first adhesive layer 50 of FIG. 6. In an embodiment, the bit line adhesive layer may include, for example, at least one among Ti, Cr, Ni, Fe, and a combination thereof. However, embodiments of the present disclosure are not necessarily limited thereto.

In an embodiment, a bit line insulating layer may be interposed between the bit line heat dissipation layer 422 and the bit line metal layer 423 (e.g., in the tenth direction D10). The bit line insulating layer may be substantially the same as, for example, the first insulating layer 60 of FIG. 8. The bit line insulating layer may increase thermal conductivity of the bit line heat dissipation layer 422. In an embodiment, the bit line insulating layer may include, for example, boron nitride. However, embodiments of the present disclosure are not necessarily limited thereto.

In an embodiment, a bit line heat dissipation layer covering the bit line metal layer 423 may be disposed on the bit line metal layer 423. The bit line heat dissipation layer may be substantially the same as the second heat dissipation layer 25 of FIGS. 4 and 5. For example, the bit line metal layer 423 may be interposed between the bit line heat dissipation layers. Since the bit line metal layer 423 is interposed between the line heat dissipation layers, electrical conductivity of the bit line metal layer 423 can be further increased.

A bit line capping pattern 440 may be disposed on the bit line BL. The bit line capping pattern 440 may include a first bit line capping pattern 441 and a second bit line capping pattern 442. The second bit line capping pattern 442 may be disposed on the first bit line capping pattern 441 (e.g., above the bit line capping pattern 441 in the tenth direction D10). The first bit line capping pattern 441 may be a portion overlapping the bit line metal layer 423 in the seventh direction D7. The second bit line capping pattern 442 may be a portion not overlapping the bit line metal layer 423 in the seventh direction D7.

Since a width W10 of the bit line metal layer 423 in the seventh direction D7 is less than a width W9 of the bit line heat dissipation layer 422 in the seventh direction D7, a space may be formed between the bit line spacer 430 and the bit line metal layer 423. The first bit line capping pattern 441 may be disposed in the space. In an embodiment, the bit line capping pattern 440 may include silicon nitride. However, embodiments of the present disclosure are not necessarily limited thereto.

A bit line spacer 430 may be disposed on a sidewall of the bit line BL and a sidewall of the bit line capping pattern 440. The bit line spacer 430 may be disposed on the third substrate 400 and the element separation layer 405 in a portion of the bit line BL where the direct contact DC is formed. However, the bit line spacer 430 may be disposed on the buffer layer 410 in a portion where the direct contact DC is not formed.

In an embodiment, the bit line spacer 430 may be a single layer. However, as shown in the drawing, in some embodiments the bit line spacer 430 may be a multilayer including first and second bit line spacers 431 and 432. For example, in an embodiment the first and second bit line spacers 431 and 432 may each include one among a silicon oxide film, a silicon nitride film, a silicon oxynitride film (SiON), a silicon oxycarbonitride film (SiOCN), air, and a combination thereof. However, embodiments of the present disclosure are not necessarily limited thereto.

The buffer layer 410 may be interposed between the bit line BL and the element separation layer 405 (e.g., in the tenth direction D10) and between the bit line spacer 430 and the third substrate 400 (e.g., in the tenth direction D10).

The bit line BL may be electrically connected to the doped region of the active area ACT through the direct contact DC. In an embodiment, the direct contact DC may be formed of, for example, polysilicon doped with an impurity.

The buried contact BC may be disposed between a pair of adjacent bit lines BL. The buried contacts BC may be spaced apart from each other (e.g., in the seventh direction D7). In an embodiment, the buried contact BC may include at least one among polysilicon doped with an impurity, a conductive silicide compound, a conductive metal nitride, and a metal. The buried contacts BC may have island shapes spaced apart from each other in a plan view. The buried contact BC passes through the buffer layer 410 to be in direct contact with the doped region of the active area ACT.

The landing pad LP may be disposed on the buried contact BC (e.g., disposed directly thereon in the tenth direction D10). The landing pad LP may be electrically connected to the buried contact BC. The landing pad LP may overlap a portion of the top surface of the bit line BL. In an embodiment, the landing pad LP may include, for example, at least one among W, a semiconductor material doped with an impurity, a conductive silicide compound, a conductive metal nitride, a conductive metal carbide, a metal, and a metal alloy.

A pad separation insulating layer 450 may be formed on the landing pad LP and the bit line BL. For example, the pad separation insulating layer 450 may be disposed on the bit line capping pattern 440. The pad separation insulating layer 450 may define an area of the landing pad LP forming a plurality of isolation areas. In addition, the pad separation insulating layer 450 may not cover a top surface of the landing pad LP.

The pad separation insulating layer 450 may include an insulating material to electrically separate a plurality of landing pads LP from each other. For example, in an embodiment the pad separation insulating layer 450 may include at least one among a silicon oxide film, a silicon nitride film, a silicon oxynitride film, a silicon oxycarbonitride film, and a silicon carbonitride film.

An etch stop layer 460 may be disposed on the pad separation insulating layer 450 and the landing pad LP (e.g., disposed on upper surfaces thereof). In an embodiment, the etch stop layer 460 may include at least one among a silicon nitride layer, a silicon carbonitride layer, a silicon boron nitride layer (SiBN), a silicon oxynitride layer, and a silicon oxycarbide layer.

A capacitor structure 470 may be disposed on the landing pad LP (e.g., disposed on an upper surface of the landing pad LP). The capacitor structure 470 may be electrically connected to the landing pad LP. A portion of the capacitor structure 470 may be disposed in the etch stop layer 460. In an embodiment, the capacitor structure 470 may include a storage electrode 471, an upper electrode 473, and a capacitor dielectric layer 472.

The storage electrode 471 may be disposed on the landing pad LP. Although it is illustrated that the storage electrode 471 has a pillar shape, embodiments of the present disclosure are not necessarily limited thereto. For example, in an embodiment the storage electrode 471 may have a cylindrical shape. The capacitor dielectric layer 472 is formed on the storage electrode 471. The capacitor dielectric layer 472 may be formed along a profile of the storage electrode 471. The upper electrode 473 is formed on the capacitor dielectric layer 472. The upper electrode 473 may surround an outer wall of the storage electrode 471.

The storage electrode 471 and the upper electrode 473 may each include, for example, a doped semiconductor material, a conductive metal nitride (e.g., titanium nitride, tantalum nitride, niobium nitride, or tungsten nitride), a metal (e.g., ruthenium, iridium, titanium, or tantalum), and a conductive metal oxide (e.g., iridium oxide or niobium oxide). However, embodiments of the present disclosure are not necessarily limited thereto.

In an embodiment, the capacitor dielectric layer 472 may include, for example, one among silicon oxide, silicon nitride, silicon oxynitride, a high-dielectric constant material, and a combination thereof. However, embodiments of the present disclosure are not necessarily limited thereto. In the semiconductor device according to some embodiments, the capacitor dielectric layer 472 may include a stacked layer structure in which zirconium oxide, aluminum oxide, and zirconium oxide are sequentially stacked. In the semiconductor device according to some embodiments, the capacitor dielectric layer 472 may include a dielectric layer including hafnium (Hf). In the semiconductor device according to some embodiments, the capacitor dielectric layer 472 may have a stacked structure of a ferroelectric material layer and a paraelectric material layer.

In concluding the detailed description, those skilled in the art will appreciate that many variations and modifications may be made to the described embodiments without substantially departing from the principles of the present disclosure. Therefore, the disclosed embodiments of the present disclosure are used in a generic and descriptive sense only and not for purposes of limitation.

What is claimed is:

1. A semiconductor device comprising:
   a substrate;
   a first heat dissipation layer disposed on the substrate and extending in a first direction; and
   a metal layer disposed on the first heat dissipation layer and extending in the first direction,
   wherein a width of the first heat dissipation layer in a second direction intersecting the first direction is greater than a width of the metal layer in the second direction and outer ends of the first heat dissipation layer are disposed outside outer ends of the metal layer in a plan view, and
   the first heat dissipation layer has a structure made of carbon atoms and includes at least one among graphene, nanotubes, and a diamond structure.

2. The semiconductor device of claim 1, further comprising a first insulating layer interposed between the first heat dissipation layer and the metal layer,
   wherein the first insulating layer includes boron nitride.

3. The semiconductor device of claim 1, further comprising a second heat dissipation layer disposed on the metal layer and covering the metal layer.

4. The semiconductor device of claim 3, wherein the second heat dissipation layer has a structure made of carbon atoms and includes at least one among graphene, nanotubes, and a diamond structure.

5. The semiconductor device of claim 3, further comprising a second insulating layer interposed between the metal layer and the second heat dissipation layer,
   wherein the second insulating layer includes boron nitride.

6. The semiconductor device of claim 3, wherein at least a portion of the second heat dissipation layer overlaps the metal layer in the second direction.

7. The semiconductor device of claim 1, further comprising an adhesive layer interposed between the first heat dissipation layer and the metal layer.

8. The semiconductor device of claim 7, wherein the adhesive layer includes at least one among titanium (Ti), chromium (Cr), nickel (Ni), iron (Fe), and a combination thereof.

9. The semiconductor device of claim 1, wherein the metal layer includes at least one among copper (Cu), ruthenium (Ru), aluminum (Al), cobalt (Co), tungsten (W), molybdenum (Mo), titanium (Ti), tantalum (Ta), nickel (Ni), platinum (Pt), chromium (Cr), and a combination thereof.

10. A semiconductor device comprising:
    a substrate;
    an active pattern on the substrate and extending in a first direction;
    a gate electrode disposed on the active pattern and extending in a second direction intersecting the first direction; and
    a line structure disposed on the gate electrode and extending in the first direction,
    wherein the line structure includes a first line heat dissipation layer and a line metal layer on the first line heat dissipation layer, a width of the first line heat dissipation layer in the second direction is greater than a width of the line metal layer in the second direction and outer ends of the first line heat dissipation layer are disposed outside outer ends of the line metal layer in a plan view, and the first line heat dissipation layer has a structure made of carbon atoms and includes at least one among graphene, nanotubes, and a diamond structure.

11. The semiconductor device of claim 10, further comprising a line insulating layer interposed between the first line heat dissipation layer and the line metal layer, wherein the line insulating layer includes boron nitride.

12. The semiconductor device of claim 10, wherein the line metal layer includes at least one among copper (Cu), ruthenium (Ru), aluminum (Al), cobalt (Co), tungsten (W), molybdenum (Mo), titanium (Ti), tantalum (Ta), nickel (Ni), platinum (Pt), chromium (Cr), and a combination thereof.

13. The semiconductor device of claim 10, further comprising a second line heat dissipation layer disposed on the line metal layer and covering the line metal layer, wherein the second line heat dissipation layer has a structure made of carbon atoms and includes at least one among graphene, nanotubes, and a diamond structure.

14. The semiconductor device of claim 13, wherein at least a portion of the second line heat dissipation layer overlaps the line metal layer in the second direction.

15. The semiconductor device of claim 10, further comprising a line adhesive layer interposed between the first line heat dissipation layer and the line metal layer, wherein the line adhesive layer includes at least one among titanium (Ti), chromium (Cr), nickel (Ni), iron (Fe), and a combination thereof.

16. A semiconductor device comprising:
a substrate;
bit lines on the substrate and extending in a first direction;
a buried contact disposed between the bit lines and connected to the substrate;
a landing pad on the buried contact; and
a capacitor structure disposed on the landing pad and connected to the landing pad, wherein the bit line includes a first bit line heat dissipation layer and a bit line metal layer on the first bit line heat dissipation layer, a width of the first bit line heat dissipation layer in a second direction intersecting the first direction is greater than a width of the bit line metal layer in the second direction and outer ends of the first bit line heat dissipation layer are disposed outside outer ends of the bit line metal layer in a plan view, and the first bit line heat dissipation layer has a structure made of carbon atoms and includes at least one among graphene, nanotubes, and a diamond structure.

17. The semiconductor device of claim 16, further comprising a bit line insulating layer interposed between the first bit line heat dissipation layer and the bit line metal layer, wherein the bit line insulating layer includes boron nitride.

18. The semiconductor device of claim 16, wherein the bit line metal layer includes at least one among copper (Cu), ruthenium (Ru), aluminum (Al), cobalt (Co), tungsten (W), molybdenum (Mo), titanium (Ti), tantalum (Ta), nickel (Ni), platinum (Pt), chromium (Cr), and a combination thereof.

19. The semiconductor device of claim 16, further comprising a second bit line beat dissipation layer disposed on the bit line metal layer and covering the bit line metal layer, wherein the second bit line heat dissipation layer has a structure made of carbon atoms and includes at least one among graphene, nanotubes, and a diamond structure.

20. The semiconductor device of claim 19, wherein at least a portion of the second bit line heat dissipation layer overlaps the bit line metal layer in the second direction.

* * * * *